United States Patent
Tsao et al.

(10) Patent No.: US 10,693,478 B2
(45) Date of Patent: Jun. 23, 2020

(54) CLOCK GENERATION SYSTEM AND METHOD HAVING TIME AND FREQUENCY DIVISION ACTIVATION MECHANISM

(71) Applicant: Realtek Semiconductor Corporation, Hsinchu (TW)

(72) Inventors: Jui-Chang Tsao, Zhubei (TW); Chen-Kuo Hwang, Hsinchu (TW); Po-Wei Liu, Zhubei (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/526,066

(22) Filed: Jul. 30, 2019

(65) Prior Publication Data
US 2020/0052707 A1  Feb. 13, 2020

(30) Foreign Application Priority Data
Jul. 30, 2018 (TW) .............................. 107126372 A

(51) Int. Cl.
| H03L 7/18 | (2006.01) |
| G06F 1/04 | (2006.01) |
| H03L 7/08 | (2006.01) |

(52) U.S. Cl.
CPC ................. *H03L 7/18* (2013.01); *G06F 1/04* (2013.01); *H03L 7/08* (2013.01)

(58) Field of Classification Search
None
See application file for complete search history.

(56) References Cited

U.S. PATENT DOCUMENTS

| 2007/0162648 A1* | 7/2007 | Tousek ................ G06F 13/1642 710/22 |
| 2014/0096101 A1* | 4/2014 | Kitaura .................. G11C 5/063 716/126 |

(Continued)

FOREIGN PATENT DOCUMENTS

| CN | 1983121 A | 6/2007 |
| TW | 200731081 A | 8/2007 |

OTHER PUBLICATIONS

Dr. Neelam R. Prakash et al., Clock Gating for Dynamic Power Reduction in Synchronous Circuits, International Journal of Engineering Trends and Technology (IJETT), 2013, vol. 4, Issue 5.

(Continued)

*Primary Examiner* — Lincoln D Donovan
*Assistant Examiner* — Khareem E Almo
(74) *Attorney, Agent, or Firm* — Locke Lord LLP; Tim Tingkang Xia, Esq.

(57) ABSTRACT

A clock generation system having a time and frequency division activation mechanism is provided that includes a clock source processing circuit that generates a primary clock signal and clock-branching circuits that perform a clock-branching generation procedure respectively in an order. Each of the clock-branching modules includes a frequency division unit and a processing unit. The frequency division unit receives the primary clock signal to divide the frequency according to a divisor number and output a branch clock signal. The processing unit controls the frequency division unit to not output the branch clock signal before the clock-branching generation procedure and to decrease the divisor number gradually over time period after the clock-branching generation procedure begins such that a branch frequency of the branch clock signal generated by the frequency division unit increases from an initial frequency (Continued)

to a final frequency to finish the clock-branching generation procedure.

12 Claims, 5 Drawing Sheets

(56) References Cited

U.S. PATENT DOCUMENTS

| | | | |
|---|---|---|---|
| 2014/0167825 A1* | 6/2014 | Dobbs | G06F 1/04 327/158 |
| 2015/0121327 A1* | 4/2015 | Kamal | G06F 30/398 716/113 |
| 2015/0220128 A1* | 8/2015 | Barrenscheen | G06F 1/324 713/322 |
| 2018/0107264 A1* | 4/2018 | Liu | G06F 1/3234 |

OTHER PUBLICATIONS

Xijiang Lin, Low Power Testing—What Can Commercial Design-for-Test Tools Provide?, Journal of Low Power Electronics and Applications, 2011, 1, 357-372.

* cited by examiner

CLOCK GENERATION SYSTEM AND METHOD HAVING TIME AND FREQUENCY DIVISION ACTIVATION MECHANISM

RELATED APPLICATIONS

This application claims priority to Taiwan Application Serial Number 107126372, filed Jul. 30, 2018, which is herein incorporated by reference.

BACKGROUND

Field of Invention

The present invention relates to a clock generation technology. More particularly, the present invention relates to a clock generation system and method having a time and frequency division activation mechanism.

Description of Related Art

In conventional circuits, a clock tree is used to branch to clock signal source to transmit the branched clock signals to different circuit blocks. However, the size of the chip is larger and the operation frequency becomes higher. When the number of the loadings that the branched clock signals supply is higher and the instant increasing of the operation frequency is larger, the voltage may drop too much in a sudden to cause false action of the circuit.

Accordingly, what is needed is a clock generation system and method having a time and frequency division activation mechanism to address the issues mentioned above.

SUMMARY

The invention provides a clock generation system having a time and frequency division activation mechanism. The clock generation system includes a clock source processing circuit and a plurality of clock-branching circuits. The clock source processing circuit is configured to generate a primary clock signal. The clock-branching circuits perform a clock-branching generation procedure respectively in an order. Each of the clock-branching circuits includes a frequency division unit and a processing unit. During the clock-branching generation procedure, the frequency division unit is configured to receive the primary clock signal to divide a frequency of the primary clock signal according to a divisor number and output a branch clock signal. The processing unit is configured to control the frequency division unit to not output the branch clock signal before the clock-branching generation procedure and to decrease the divisor number gradually over the time period from an initial divisor number larger than one to a final divisor number after the clock-branching generation procedure begins such that a branch frequency of the branch clock signal generated by the frequency division unit increases from an initial frequency to a final frequency to finish the clock-branching generation procedure.

Another aspect of the present invention is to provide a clock generation method having a time and frequency division activation mechanism. The clock generation method includes the steps outlined below. A primary clock signal is generated by a clock source processing circuit. A frequency division unit included in each of a plurality of clock-branching circuits is controlled to not output a branch clock signal before a clock-branching generation procedure by a processing unit included in each of the clock-branching circuits. The clock-branching generation procedure is performed respectively in an order by the clock-branching circuits, wherein the clock-branching generation procedure includes the steps outlined below. The primary clock signal is received to divide a frequency of the primary clock signal according to a divisor number and output a branch clock signal by the frequency division unit. The divisor number is decreased gradually over the time period from an initial divisor number larger than one to a final divisor number such that a branch frequency of the branch clock signal generated by the frequency division unit increases from an initial frequency to a final frequency to finish the clock-branching generation procedure by the processing unit.

These and other features, aspects, and advantages of the present invention will become better understood with reference to the following description and appended claims.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

In order to make the objects, technical solutions and advantages of the present disclosure apparent, diagrams in combination of examples are used to describe the present disclosure in further detail. It should be understood that the specific embodiments described herein are merely examples for explaining the present disclosure and are not intended to limit the present disclosure.

Figure 1:
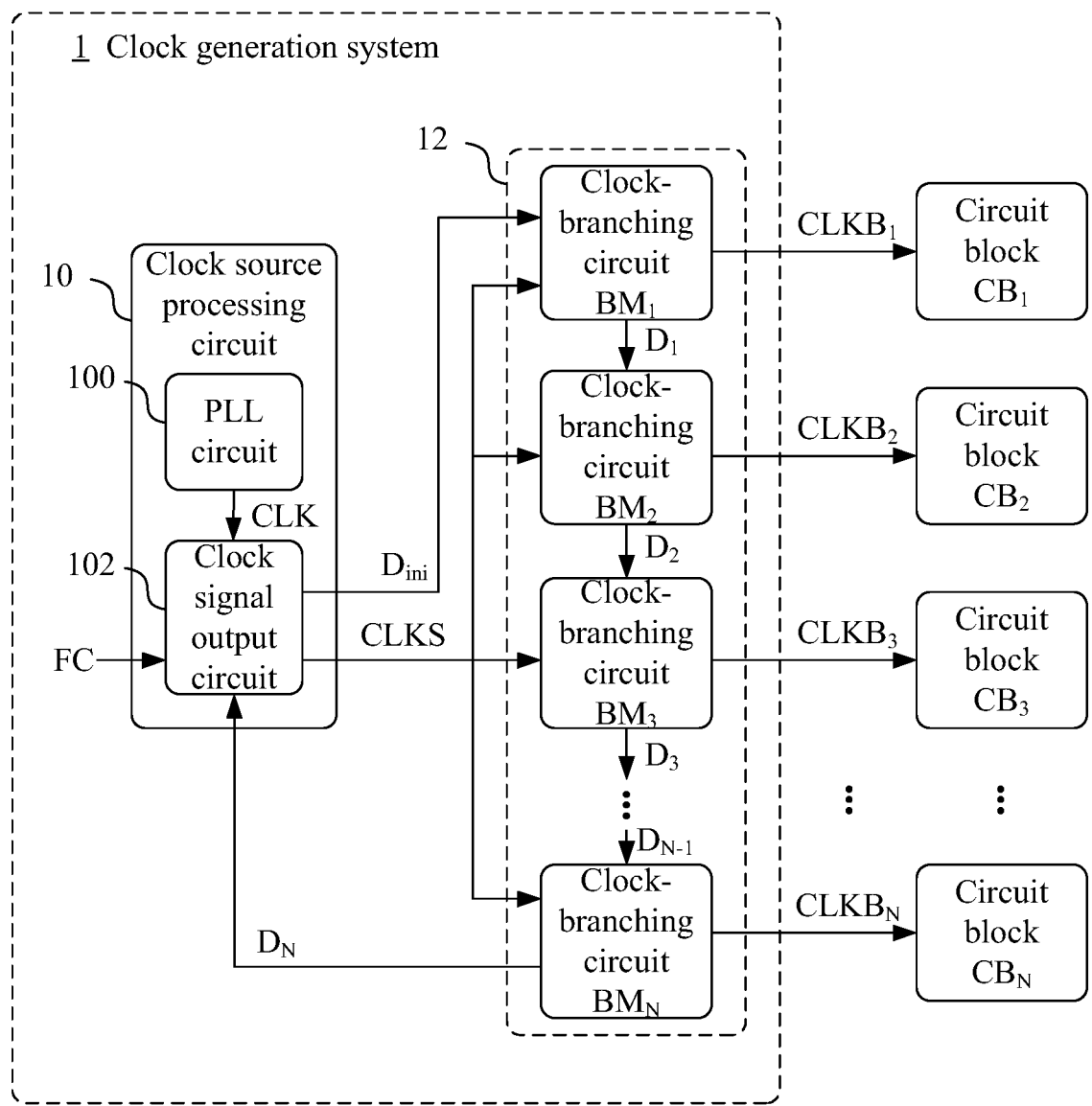
FIG. 1 is a block diagram of a clock generation system having a time and frequency division activation mechanism in an embodiment of the present invention.

Reference is now made to FIG. 1. FIG. 1 is a block diagram of a clock generation system 1 having a time and frequency division activation mechanism in an embodiment of the present invention.

The clock generation system 1 includes a clock source processing circuit 10 and a plurality of clock-branching circuits 12. The clock-branching circuits 12 actually include N clock-branching circuits $BM_1$-$BM_N$. Each of the clock-branching circuits $BM_1$-$BM_N$ is considered as a branching block.

The clock source processing circuit 10 includes a phase-locked loop (PLL) circuit 100 and a clock signal output circuit 102. The phase-locked loop circuit 100 is configured to generate a clock signal CLK. The clock signal output circuit 102 is configured to receive the clock signal CLK to output a primary clock signal CLKS.

The clock-branching circuits 12 receive the primary clock signal CLKS respectively to generate N branch clock signals $CLKB_1$-$CLKB_N$ according to the primary clock signal CLKS to transmit the branch clock signals $CLKB_1$-$CLKB_N$ correspondingly to the circuit blocks $CB_1$-$CB_N$ such that the circuit blocks $CB_1$-$CB_N$ operate according to the branch clock signals $CLKB_1$-$CLKB_N$ respectively.

As a result, the clock generation system 1 forms a clock tree structure. In an embodiment, the clock-branching circuits $BM_1$-$BM_N$ are connected in the form of such as, but not limited to a daisy chain.

In an embodiment, when the clock generation system 1 starts to operate or when the clock generation system 1 adjusts the frequency of the branch clock signals $CLKB_1$-$CLKB_N$ from a lower frequency to a higher frequency during operation, a sudden large voltage drop may occur due to a large current draining activity. As a result, the clock generation system 1 has a time and frequency division activation mechanism to prevent the occurrence of the sudden large voltage drop.

The time and frequency division activation mechanism of the clock generation system 1 of the present invention is described in detail in the following paragraphs.

Figure 2:
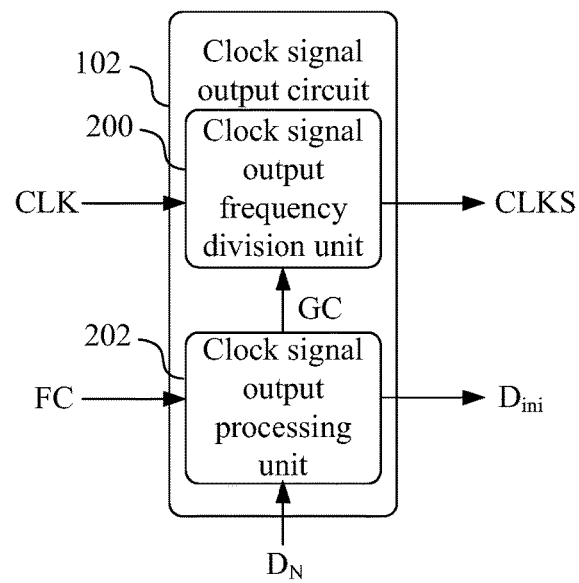
FIG. 2 is a block diagram of the clock signal output circuit in an embodiment of the present invention.

Reference is now made to FIG. 2. FIG. 2 is a block diagram of the clock signal output circuit 102 in an embodiment of the present invention. The clock signal output circuit 102 includes a clock signal output frequency division unit 200 and a clock signal output processing unit 202.

The clock signal output frequency division unit 200 is configured to receive the clock signal CLK from the phase-locked loop circuit 100 in FIG. 1 to divide a frequency of the clock signal CLK according to an output divisor number and output the primary clock signal CLKS during a primary clock signal generation procedure.

The clock signal output processing unit 202 is configured to control the clock signal output frequency division unit 200 to not output the primary clock signal CLKS before the primary clock signal generation procedure, and to decrease the output divisor number gradually over the time period from an initial output divisor number larger than one to a final output divisor number after the primary clock signal generation procedure begins. In an embodiment, the clock signal output processing unit 202 controls the output of the clock signal output frequency division unit 200 by generating a control signal GC.

As a result, a primary frequency of the primary clock signal CLKS generated by the clock signal output frequency division unit 200 increases from an initial output frequency to a final output frequency to finish the primary clock signal generation procedure.

Figure 3:
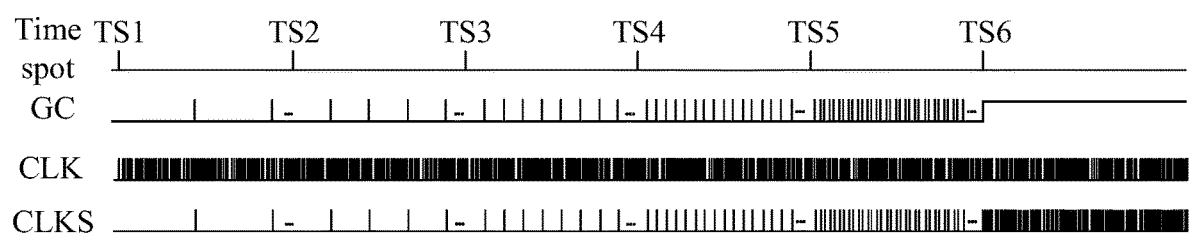
FIG. 3 is a diagram of the waveform of the primary clock signal during the primary clock signal generation procedure.

Reference is now made to FIG. 3. FIG. 3 is a diagram of the waveform of the primary clock signal CLKS during the primary clock signal generation procedure.

In an embodiment, the clock signal output frequency division unit 200 performs the frequency dividing process by using a gating method. For example, the clock signal output frequency division unit 200 may include an AND gate having a deglitch ability and the AND gate is controlled by the control signal GC generated by the clock signal output processing unit 202.

As a result, before the primary clock signal generation procedure begins, the clock signal output processing unit 202 generates the control signal GC having a low level such that whether the status of the primary clock signal CLK transits or not, the clock signal output frequency division unit 200 keeps outputting a low level. The primary clock signal CLKS is therefore not outputted.

Between the time spots TS1 and TS2, the control signal GC generated by the clock signal output processing unit 202 can have high state sections that appear according to 1/32 of the frequency of the clock signal CLK while other sections are at the low state. As a result, the clock signal output frequency division unit 200 can output the primary clock signal CLKS having a frequency that is 1/32 of the frequency of the clock signal CLK.

Similarly, between the time spots TS2 and TS3, between the time spots TS3 and TS4, between the time spots TS4 and TS5 and between the time spots TS5 and TS6, the control signal GC controls the clock signal output frequency division unit 200 to output the primary clock signal CLKS having a frequency that is 1/16, 1/8, 1/4 and 1/2 of the frequency of the clock signal CLK respectively. After the time spot TS6, the control signal GC becomes totally high state to control the clock signal output frequency division unit 200 to output the primary clock signal CLKS having the same frequency as the clock signal CLK. As a result, the generation of the primary clock signal CLKS can have the time and frequency division activation mechanism.

After the frequency of the primary clock signal CLKS reaches the frequency of the clock signal CLK, the clock signal output processing unit 202 transmits an initializing signal $D_{ini}$ to the clock-branching circuit $BM_1$ such that the clock-branching circuits $BM_1$-$BM_N$ perform a clock-branching generation procedure respectively in an order.

Figure 4:
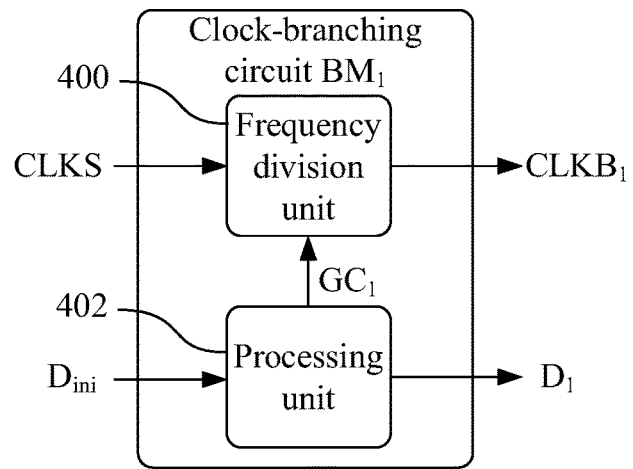
FIG. 4 is a block diagram of the clock-branching circuit in an embodiment of the present invention.

Reference is now made to FIG. 4. FIG. 4 is a block diagram of the clock-branching circuit $BM_1$ in an embodiment of the present invention. The clock-branching circuit $BM_1$ includes a frequency division unit 400 and a processing unit 402.

Similar to the clock signal output frequency division unit 200 and the clock signal output processing unit 202 included in the clock signal output circuit 102, the frequency division unit 400 in the clock-branching circuit $BM_1$ is configured to receive the primary clock signal CLKS to divide a frequency of the primary clock signal CLKS according to a divisor number and output the branch clock signal $CLKB_1$.

The processing unit 402 in the clock-branching circuit $BM_1$ is configured to control the frequency division unit 400 to not output the branch clock signal $CLKB_1$ before the clock-branching generation procedure and perform the clock-branching generation procedure after receiving the initializing signal $D_{ini}$. The divisor number is decreased gradually over the time period from an initial divisor number larger than one to a final divisor number after the clock-branching generation procedure begins. In an embodiment, the processing unit 402 controls the output of the frequency division unit 400 by generating a control signal $GC_1$.

As a result, the branch frequency of the branch clock signal $CLKB_1$ generated by the frequency division unit 400 increases from an initial frequency to a final frequency to finish the clock-branching generation procedure. In an embodiment, the implementation of the frequency division unit 400 and the control mechanism performed on the frequency division unit 400 by the processing unit 402 are identical to those of the clock signal output frequency division unit 200 and the clock signal output processing unit 202. Therefore, the detail is not described herein.

In an embodiment, the configuration and the operation of the clock-branching circuits $BM_2$-$BM_N$ can be the same as those of the clock-branching circuit $BM_1$. As a result, after the clock-branching circuits $BM_1$-$BM_{N-1}$ output the branch clock signals $CLKB_1$-$CLKB_{N-1}$, the clock-branching circuits $BM_1$-$BM_{N-1}$ respectively transmit triggering signals $D_1$-$D_{N-1}$ to the next clock-branching circuits $BM_2$-$BM_N$ such that the clock-branching circuits $BM_2$-$BM_N$ perform the clock-branching generation procedure subsequently. Further, after the final clock-branching circuit $BM_N$ finishes the clock-branching generation procedure, the clock-branching circuit $BM_N$ transmits the triggering signal $D_N$ to the clock signal output processing unit 202 illustrated in FIG. 2 to notify the clock signal output processing unit 202 that the clock-branching generation procedure of all the clock-branching circuits $BM_1$-$BM_N$ is finished.

The procedure that the clock generation system 1 outputs the branch clock signals $CLKB_1$-$CLKB_N$ is described below by using an example under the condition that N is 4.

Figure 5:
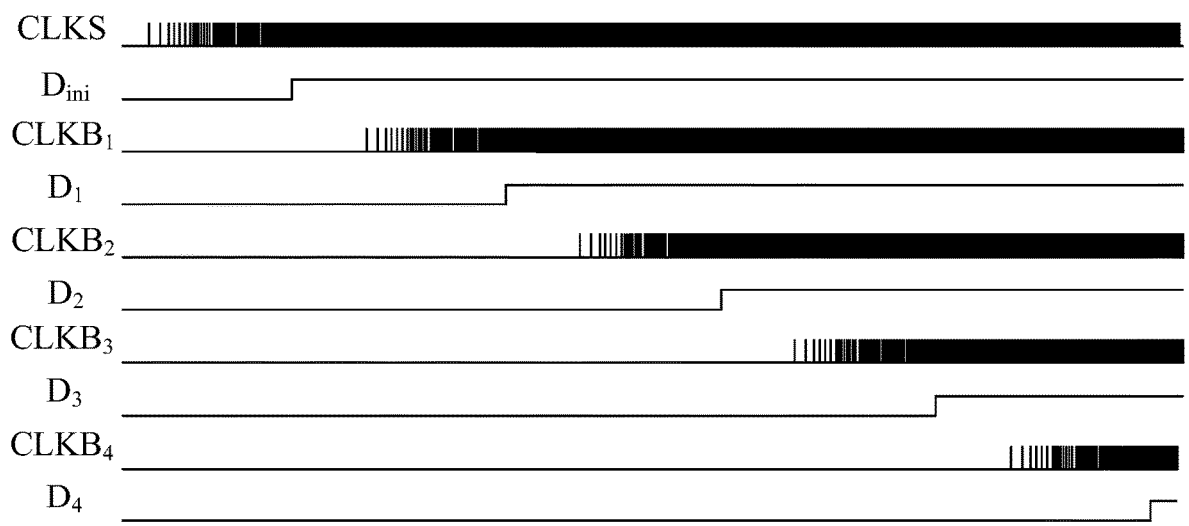
FIG. 5 is a diagram of the waveforms of the primary clock signal and the branch clock signals in an embodiment of the present invention.

Reference is now made to FIG. 5. FIG. 5 is a diagram of the waveforms of the primary clock signal CLKS and the branch clock signals $CLKB_1$-$CLKB_4$ in an embodiment of the present invention.

As illustrated in FIG. 5, after the primary clock signal CLKS is generated, the clock-branching circuits $BM_1$-$BM_4$ respectively receive the initializing signal $D_{ini}$ and the triggering signals $D_1$-$D_3$ to perform the clock-branching generation procedure and output the branch clock signals $CLKB_1$-$CLKB_4$ according to the primary clock signal CLKS. After the clock-branching circuit $BM_4$ outputs the corresponding branch clock signal $CLKB_4$, the clock-branching circuit $BM_4$ further transmits the triggering signal $D_4$ to the clock signal output processing unit 202 to notify the clock signal output processing unit 202 that the clock-branching generation procedure of all the clock-branching circuits $BM_1$-$BM_4$ is finished.

As a result, the clock-branching circuits $BM_1$-$BM_N$ of the clock generation system 1 can use a time and frequency division activation mechanism to generate the branch clock signals $CLKB_1$-$CLKB_N$ such that when the loading of that the branching clock signals support is larger, the occurrence of the sudden large voltage drop can be prevented.

The operation of the clock generation system 1 described above can be performed when the clock generation system 1 starts to operate or when the clock generation system 1 adjusts the frequency of the outputted clock signal during the operation. It is appreciated that during the operation, the clock generation system 1 can receive a frequency adjusting command FC from an external circuit by using the clock signal output processing unit 202 included in the clock signal output circuit 102 of the clock source processing circuit 10 to adjust the frequency. More specifically, when the clock signal output circuit 102 receives the frequency adjusting command FC during the operation of the clock generation system 1, the clock signal output circuit 102 transmits the initializing signal $D_{ini}$ to the clock-branching circuit $BM_1$ such that the clock-branching circuits $BM_1$-$BM_N$ stop to output the branch clock signals $CLKB_1$-$CLKB_N$ in the order. The clock signal output circuit 102 further stops to output the primary clock signal CLKS and restarts according to the frequency adjusting command FC to generate the primary clock signal CLKS.

The procedure that the clock generation system 1 stops to output the branch clock signals $CLKB_1$-$CLKB_N$ is described below by using an example under the condition that N is 4.

Figure 6:
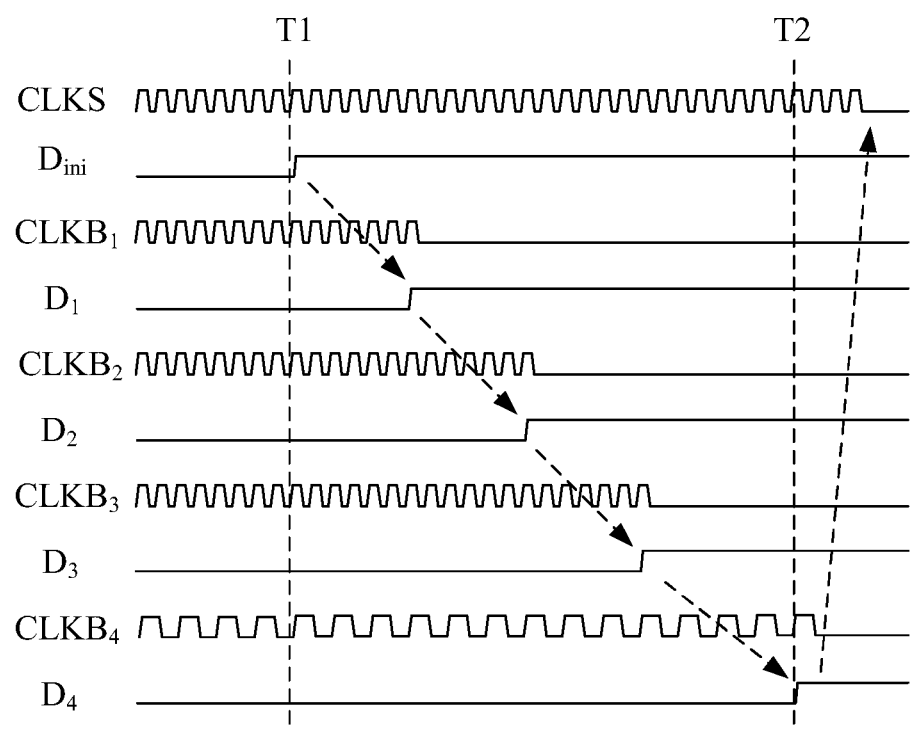
FIG. 6 is a diagram of waveforms of the branch clock signals and the triggering signals generated by the clock-branching circuit in an embodiment of the present invention.

Reference is now made to FIG. 6. FIG. 6 is a diagram of waveforms of the branch clock signals $CLKB_1$-$CLKB_4$ and the triggering signals $D_4$-$D_4$ generated by the clock-branching circuit $BM_1$-$BM_4$ in an embodiment of the present invention. In FIG. 6, an arrow with a dashed line indicates the order of the circuits to stop outputting the clock signals.

As illustrated in FIG. 6, between the time spots T1 and T2, the clock-branching circuits $BM_1$-$BM_4$ receive the initializing signal $D_{ini}$ and the triggering signal $D_1$-$D_3$ to stop outputting the branch clock signals $CLKB_1$-$CLKB_4$ in the order. After all the clock-branching circuits $BM_1$-$BM_4$ stop outputting the branch clock signals $CLKB_1$-$CLKB_4$, the clock-branching circuit $BM_4$ transmits the triggering signal $D_4$ to the clock signal output circuit 102 such that the clock signal output circuit 102 stops outputting the primary clock signal CLKS as well. The gating method described above can be used as the mechanism for stopping outputting the branch clock signals $CLKB_1$-$CLKB_4$ and the primary clock signal CLKS. After all the circuits stop outputting the clock signals, the clock generation system 1 generates the branch clock signals $CLKB_1$-$CLKB_4$ having the new frequency according to the frequency adjusting command FC based on the operation method described above.

Figure 7:
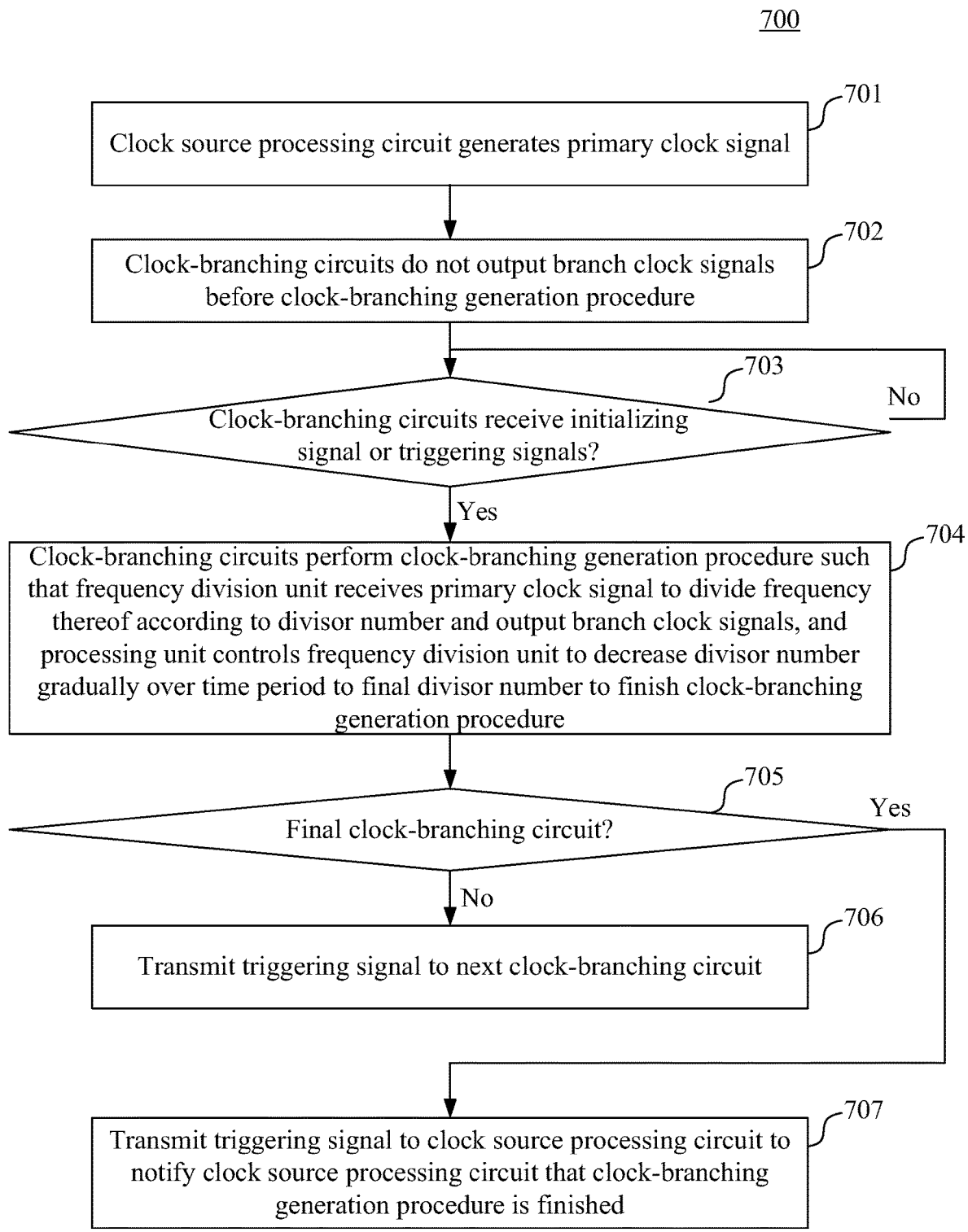
FIG. 7 is a flow chart of the clock generation method in an embodiment of the present invention.

FIG. 7 is a flow chart of the clock generation method 700 in an embodiment of the present invention. The clock generation method 700 can be used in the clock generation system 1 illustrated in FIG. 1. The clock generation method 700 includes the steps outlined below (The steps are not recited in the sequence in which the steps are performed. That is, unless the sequence of the steps is expressly indicated, the sequence of the steps is interchangeable, and all or part of the steps may be simultaneously, partially simultaneously, or sequentially performed).

In step 701, the clock source processing circuit 10 generates the primary clock signal CLKS.

In step 702, the frequency division unit 400 included in each of the clock-branching circuits $BM_1$-$BM_N$ is controlled to not output the branch clock signals $CLKB_1$-$CLKB_N$ before the clock-branching generation procedure by the processing unit 400 included in each of the clock-branching circuits $BM_1$-$BM_N$.

In step 703, the clock-branching circuits, e.g. the clock-branching circuits $BM_1$-$BM_N$, determine whether the initializing signal $D_{ini}$ or the triggering signals $D_1$-$D_{N-1}$ is received.

When the clock-branching circuits do not receive the initializing signal $D_{ini}$ or the triggering signals $D_1$-$D_{N-1}$, the flow goes back to step 703 to keep determining.

When the clock-branching circuits receive the initializing signal $D_{ini}$ or the triggering signals $D_1$-$D_{N-1}$, in step 704, the clock-branching circuits, e.g. the clock-branching circuits $BM_1$-$BM_N$, perform the clock-branching generation procedure such that the frequency division unit 400 receives the primary clock signal CLKS to divide the frequency of the primary clock signal CLKS according to the divisor number and output the branch clock signals $CLKB_1$-$CLKB_N$. The processing unit 402 controls the frequency division unit 400 to decrease the divisor number gradually over the time period from the initial divisor number larger than one to the final divisor number after the clock-branching generation procedure begins such that the branch frequency of the branch clock signal, e.g. the branch clock signals $CLKB_{-1}$-$CLKB_N$, generated by the frequency division unit 400 increases from an initial frequency to a final frequency to finish the clock-branching generation procedure.

In step 705, whether the clock-branching circuit is the final clock-branching circuit is determined.

When the clock-branching circuit is not the final clock-branching circuit $BM_N$, in step 706, the triggering signal, e.g. the triggering signals $D_1$-$D_{N-1}$, is transmitted to the next clock-branching circuit.

When the clock-branching circuit is the final clock-branching circuit $BM_N$, in step 707, the triggering signal $D_N$ is transmitted to the clock source processing circuit 10 to notify the clock source processing circuit 10 that the clock-branching generation procedure is finished.

As a result, the steps 702-707 in FIG. 7 are performed on all the clock-branching circuits until the clock-branching generation procedure of all the clock-branching circuits is finished.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A clock generation system having a time and frequency division activation mechanism comprising:
    a clock source processing circuit configured to generate a primary clock signal; and
    a plurality of clock-branching circuits that perform a clock-branching generation procedure respectively in an order each comprising:
        a frequency division unit, during the clock-branching generation procedure, configured to receive the primary clock signal to divide a frequency of the primary clock signal according to a divisor number and output a branch clock signal; and
        a processing unit configured to control the frequency division unit to not output the branch clock signal before the clock-branching generation procedure and to decrease the divisor number gradually over the time period from an initial divisor number larger than one to a final divisor number after the clock-branching generation procedure begins such that a branch frequency of the branch clock signal generated by the frequency division unit increases from an initial frequency to a final frequency to finish the clock-branching generation procedure.

2. The clock generation system of claim 1, wherein each of the clock-branching circuits corresponds to a circuit block such that the frequency division unit outputs the branch clock signal to the circuit block.

3. The clock generation system of claim 1, wherein after generating the primary clock signal, the clock source processing circuit transmits an initializing signal to trigger a first one of the clock-branching circuits to perform the clock-branching generation procedure, each of the clock-branching circuits generates a triggering signal after the respective clock-branching generation procedure is finished to trigger the next one of the clock-branching circuits to perform the clock-branching generation procedure and the last one of the clock-branching circuits generates the triggering signal to the clock source processing circuit after the clock-branching generation procedure is finished.

4. The clock generation system of claim 1, wherein the clock source processing circuit controls the clock-branching circuits to stop outputting the branch clock signal in the order according to a frequency-adjusting command and the clock source processing circuit further stops to output the primary clock signal such that the clock source processing circuit restarts to generate the primary clock signal.

5. The clock generation system of claim 1, wherein the clock source processing circuit comprises:
    a phase-locked loop circuit configured to generate a clock signal; and
    a clock signal output circuit configured to perform a primary clock signal generation procedure and comprises:
        a clock signal output frequency division unit, during the primary clock signal generation procedure, configured to receive the clock signal to divide a frequency of the clock signal according to an output divisor number and output the primary clock signal; and
        a clock signal output processing unit configured to control the clock signal output frequency division unit to not output the primary clock signal before the primary clock signal generation procedure and to decrease the output divisor number gradually over the time period from an initial output divisor number larger than one to a final output divisor number after the primary clock signal generation procedure begins such that a primary frequency of the primary clock signal generated by the clock signal output frequency division unit increases from an initial output frequency to a final output frequency to finish the primary clock signal generation procedure.

6. The clock generation system of claim 1, wherein the clock-branching circuits are connected in the form of a daisy chain.

7. A clock generation method having a time and frequency division activation mechanism comprising:
    generating a primary clock signal by a clock source processing circuit;
    controlling a frequency division unit comprised in each of a plurality of clock-branching circuits to not output a branch clock signal before a clock-branching generation procedure by a processing unit comprised in each of the clock-branching circuits; and
    performing the clock-branching generation procedure respectively in an order by the clock-branching circuits, wherein the clock-branching generation procedure comprises:
        receiving the primary clock signal to divide a frequency of the primary clock signal according to a divisor number and output a branch clock signal by the frequency division unit; and
        decreasing the divisor number gradually over the time period from an initial divisor number larger than one to a final divisor number such that a branch frequency of the branch clock signal generated by the frequency division unit increases from an initial frequency to a final frequency to finish the clock-branching generation procedure by the processing unit.

8. The clock generation method of claim 7, further comprising:
    outputting the branch clock signal to a circuit block that one of the clock-branching circuits corresponds by the frequency division unit.

9. The clock generation method of claim 7, further comprising:
    transmitting an initializing signal to trigger a first one of the clock-branching circuits to perform the clock-branching generation procedure by the clock source processing circuit after the primary clock signal is generated;
    generating a triggering signal by each of the clock-branching circuits after the respective clock-branching generation procedure is finished to trigger the next one of the clock-branching circuits to perform the clock-branching generation procedure; and generating the triggering signal to the clock source processing circuit by the last one of the clock-branching circuits after the clock-branching generation procedure is finished.

10. The clock generation method of claim 7, further comprising:
controlling the clock-branching circuits to stop outputting the branch clock signal in the order according to a frequency-adjusting command by the clock source processing circuit and further stopping to output the primary clock signal by the clock source processing circuit such that the clock source processing circuit restarts to generate the primary clock signal.

11. The clock generation method of claim 7, wherein the clock source processing circuit comprises:
generating a clock signal by a phase-locked loop circuit comprised in the clock source processing circuit;
controlling a clock signal output frequency division unit comprised in a clock signal output circuit of the clock source processing circuit to not output the primary clock signal before the primary clock signal generation procedure by a clock signal output processing unit comprised in the clock signal output circuit; and
performing the primary clock signal generation procedure by the clock signal output circuit, wherein the primary clock signal generation procedure comprises:
receiving the clock signal to divide a frequency of the clock signal according to an output divisor number and output the primary clock signal by the clock signal output frequency division unit; and
decreasing the output divisor number gradually over the time period from an initial output divisor number larger than one to a final output divisor number after the primary clock signal generation procedure begins by the clock signal output processing unit such that a primary frequency of the primary clock signal generated by the clock signal output frequency division unit increases from an initial output frequency to a final output frequency to finish the primary clock signal generation procedure.

12. The clock generation method of claim 7, wherein the clock-branching circuits are connected in the form of a daisy chain.

* * * * *